United States Patent
Park et al.

(10) Patent No.: US 11,074,842 B2
(45) Date of Patent: Jul. 27, 2021

(54) GATE DRIVING CIRCUIT AND DISPLAY DEVICE INCLUDING THE SAME

(71) Applicant: LG DISPLAY CO., LTD., Seoul (KR)

(72) Inventors: Chansoo Park, Goyang-si (KR); Seeung Lee, Bucheon-si (KR)

(73) Assignee: LG DISPLAY CO., LTD., Seoul (KR)

(*) Notice: Subject to any disclaimer, the term of this patent is extended or adjusted under 35 U.S.C. 154(b) by 102 days.

(21) Appl. No.: 16/433,350

(22) Filed: Jun. 6, 2019

(65) Prior Publication Data

US 2019/0378448 A1 Dec. 12, 2019

(30) Foreign Application Priority Data

Jun. 8, 2018 (KR) .................... 10-2018-0066027

(51) Int. Cl.
| | |
|---|---|
| *G11C 19/00* | (2006.01) |
| *G09G 3/20* | (2006.01) |
| *G09G 3/3266* | (2016.01) |
| *G09G 3/36* | (2006.01) |
| *G11C 19/28* | (2006.01) |

(52) U.S. Cl.
CPC ............ *G09G 3/20* (2013.01); *G09G 3/3266* (2013.01); *G09G 3/3677* (2013.01); *G11C 19/28* (2013.01); *G11C 19/287* (2013.01); *G09G 2300/0426* (2013.01); *G09G 2310/0286* (2013.01); *G09G 2310/08* (2013.01); *G09G 2380/10* (2013.01)

(58) Field of Classification Search
None
See application file for complete search history.

(56) References Cited

U.S. PATENT DOCUMENTS

| | | | | |
|---|---|---|---|---|
| 5,222,082 A | * | 6/1993 | Plus ..................... | G09G 3/3677 377/79 |
| 6,426,743 B1 | * | 7/2002 | Yeo ..................... | G09G 3/3677 345/100 |
| 6,556,646 B1 | * | 4/2003 | Yeo ..................... | G09G 3/3677 377/54 |
| 6,813,332 B2 | * | 11/2004 | Nagao ................... | G11C 19/00 377/79 |
| 7,492,853 B2 | * | 2/2009 | Tobita ................... | G11C 19/28 377/64 |
| 7,505,023 B2 | * | 3/2009 | Jang ..................... | G09G 3/3674 345/100 |
| 10,198,987 B2 | * | 2/2019 | Shim .................... | G11C 19/184 |

(Continued)

FOREIGN PATENT DOCUMENTS

KR 20140067472 A 6/2014

*Primary Examiner* — Tuan T Lam
(74) *Attorney, Agent, or Firm* — Polsinelli PC

(57) ABSTRACT

A gate driving circuit includes a plurality of stages connected to one another, wherein each of the plurality of stages includes an output unit which outputs a first clock signal as a gate voltage in accordance with a voltage of a Q node and a voltage of a QB node; a first node control unit which controls the voltage of the Q node; and a second node control unit which controls the QB node, wherein the first node control unit includes second and third transistors which discharge the Q node, the second transistor outputs a ground voltage to the Q node in response to a second clock signal, and the third transistor outputs the ground voltage to the Q node in response to the voltage of the QB node.

10 Claims, 7 Drawing Sheets

(56) References Cited

U.S. PATENT DOCUMENTS

| | | | | |
|---|---|---|---|---|
| 2002/0044625 | A1* | 4/2002 | Kim | G11C 19/28 377/54 |
| 2005/0220262 | A1* | 10/2005 | Moon | G11C 19/28 377/64 |
| 2006/0007085 | A1* | 1/2006 | Kim | G11C 19/28 345/87 |
| 2008/0101529 | A1* | 5/2008 | Tobita | G11C 19/28 377/64 |
| 2011/0228893 | A1* | 9/2011 | Tobita | G11C 19/28 377/77 |
| 2011/0274234 | A1* | 11/2011 | Sakamoto | H01L 27/12 377/64 |
| 2013/0077736 | A1* | 3/2013 | Son | G09G 3/2085 377/69 |
| 2014/0098015 | A1* | 4/2014 | Wang | G09G 3/3677 345/100 |
| 2016/0012911 | A1* | 1/2016 | Han | G09G 3/2096 377/64 |
| 2017/0316751 | A1* | 11/2017 | Wang | G11C 19/28 |

* cited by examiner

GATE DRIVING CIRCUIT AND DISPLAY DEVICE INCLUDING THE SAME

CROSS-REFERENCE TO RELATED APPLICATION

This application claims the priority of Korean Patent Application No. 10-2018-0066027 filed on Jun. 8, 2018, in the Korean Intellectual Property Office, which is incorporated herein by reference in its entirety.

BACKGROUND

Field of the Disclosure

The present disclosure relates to a display device, and more particularly, to a gate driving circuit mounted in the form of a gate in panel (GIP) and a display device including the same.

Description of the Background

As it enters the information era, a display field which visually expresses electrical information signals has been rapidly developed, and in response to this, various display devices having desirable characteristics such as thin-thickness, light weight, and low power consumption have been developed. Examples of such a display device include a liquid crystal display device (LCD) and an organic light emitting display device (OLED).

Such a display device includes a display panel in which pixel arrays for displaying images are disposed and driving circuits such as a data driving circuit which supplies a data signal to data lines disposed in the display panel, a gate driving circuit which sequentially supplies gate pulses to gate lines disposed in a display area, and a timing controller which controls the data driving circuit and the gate driving circuit.

In recent years, among the driving circuits, a gate driving circuit is applied to a display device in the form of a gate in panel (hereinafter referred to as "GIP") which is equipped in a display panel together with pixel arrays.

The GIP includes a shift register which sequentially outputs gate voltages and the shift register includes a plurality of stages which is connected to each other.

Each stage includes a pull-up transistor which outputs a gate voltage in accordance with a voltage of a Q node and a plurality of transistors which controls the voltage of the Q node.

Recently, since the display device is used in various fields such as a vehicle, in order to operate the display device in a severe environment such as a low temperature or a high temperature, the GIP needs to normally output the gate voltage at a predetermined timing.

However, in the harsh environment of a low temperature and a high temperature, on-currents of the plurality of transistors which controls the voltage of the Q node are rapidly reduced so that the Q node is not normally controlled. Accordingly, the pull-up transistor which outputs the gate voltage in accordance with the voltage of the Q node does not normally operate.

Therefore, since the GIP outputs a gate voltage at an undesirable timing in the severe environment of the low temperature and the high temperature, there is a problem in that the display device including the GIP is not normally driven.

SUMMARY

Accordingly, the present disclosure is to provide a gate driving circuit with an improved reliability in harsh environment of a low temperature and a high temperature and a display device including the same.

Also, the present disclosure is to provide a gate driving circuit in which a discharging speed lowering phenomenon of a Q node is improved and a display device including the same.

In addition, the present disclosure is to provide a gate driving circuit with a simplified circuit structure of each stage and a display device including the same.

The present disclosure is not limited to the above-mentioned aspects, and the other aspects, which are not mentioned above, can be clearly understood by those skilled in the art from the following descriptions.

According to an aspect of the present disclosure, a gate driving circuit includes a plurality of stages which is connected to each other, each of the plurality of stages includes an output unit which outputs a first clock signal as a gate voltage in accordance with a voltage of a Q node and a voltage of a QB node, a first node control unit which controls the voltage of the Q node, and a second node control unit which controls the QB node, and the first node control unit includes a second transistor which discharges the Q node and a third transistor which discharges the Q node, the second transistor outputs a ground voltage to the Q node, in response to a second clock signal and the third transistor outputs the ground voltage to the Q node, in response to the voltage of the QB node. Therefore, it is possible to improve the discharging speed lowering phenomenon of the Q node of the gate driving circuit in a severe environment of a low temperature and a high temperature.

According to another aspect of the present disclosure, a display device includes a display panel including a plurality of pixels; a gate driving circuit including a plurality of stages sequentially output a gate voltage to the plurality of pixels; and a timing controller which controls the driving of the gate driving circuit, wherein each of the plurality of stages includes, an output unit which outputs a first clock signal as a gate voltage in accordance with a voltage of a Q node and a voltage of a QB node, a first node control unit which controls the voltage of the Q node, and a second node control unit which controls the voltage of the QB node, wherein and the first node control unit includes a second transistor which discharges the Q node in response to a second clock signal and a third transistor which discharges the Q node, in response to the voltage of the QB node. Therefore, reliability of the display device can be improved under harsh environment of a low temperature and a high temperature.

According to a further aspect of the present disclosure, a gate driving circuit including a plurality of stages connected to one another, each stage including an output unit which outputs a first clock signal as a gate voltage in accordance with a voltage of a Q node and a voltage of a QB node; a first node control unit which controls the voltage of the Q node; and a second node control unit which controls the QB node, wherein the first node control unit includes a first transistor which charges the Q node, a reset transistor which outputs the ground voltage to the Q node in response to a gate start signal, and a third transistor which discharges the Q node, wherein the second transistor outputs a ground voltage to the Q node, in response to a second clock signal and the third transistor outputs the ground voltage to the Q node, in response to the voltage of the QB node.

According to the present disclosure, a transistor which is applied with a clock signal to control a Q node is equipped to improve a discharging speed of a Q node.

According to the present disclosure, the discharging speed of the Q node is improved so that the gate voltages may be sequentially output in accordance with a normal timing, even in a severe environment of a low temperature and a high temperature, thereby improving the reliability of the display device.

According to the present disclosure, a transistor for frame reset and a transistor for Q node control are combined to minimize a number of transistors of each stage, thereby improving an integration efficiency of the GIP.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
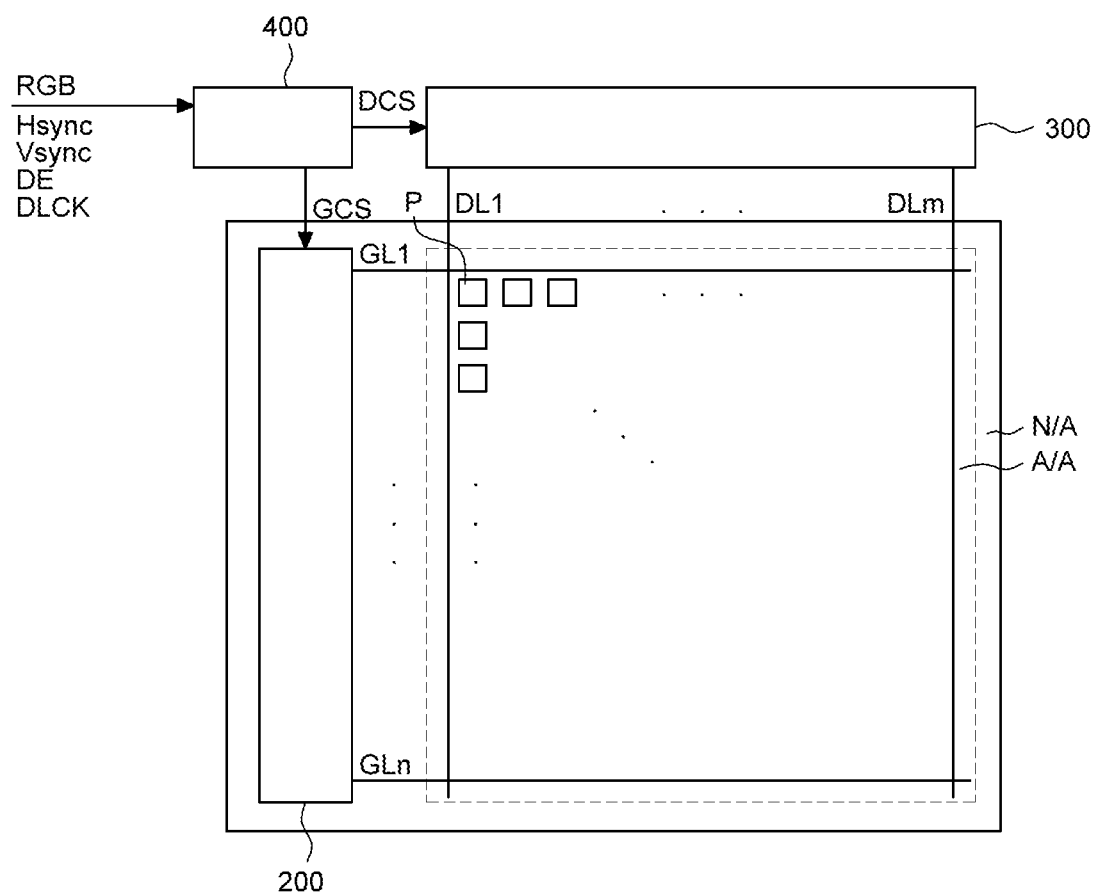
FIG. 1 is a block diagram illustrating a display device according to an aspect of the present disclosure.

Advantages and characteristics of the present disclosure and a method of achieving the advantages and characteristics will be clear by referring to aspects described below in detail together with the accompanying drawings. However, the present disclosure is not limited to the aspects disclosed herein but will be implemented in various forms. The aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device and a gate driving circuit according to aspects of the present disclosure will be described in detail with reference to accompanying drawings.

FIG. 1 is a block diagram illustrating a display device according to an aspect of the present disclosure.

Referring to FIG. 1, a display device 100 according to an aspect of the present disclosure includes a display panel 100, a gate driving circuit 200, a data driving circuit 300, and a timing controller 400.

The display panel 100 includes a display area A/A where images are displayed and a non-display area N/A in which various signal lines or driving circuits are disposed at the outside of the display area A/A.

The display area A/A includes a plurality of pixels P and displays images based on a gray scale displayed by each pixel P. In the display area A/A, n gate lines GL1 to GLn are disposed in a first direction and m data lines DL1 to DLm are disposed in a direction different from the first direction. The plurality of pixels P is electrically connected to the n gate lines GL1 to GLn and the m data lines DL1 to DLm and displays images by a driving signal or a driving voltage applied through the gate lines GL1 to GLn and the data lines DL1 to DLm.

In the non-display area N/A, various signal lines which transmit signals for controlling an operation of pixels P disposed in the display area A/A, for example, the gate driving circuit 200 is disposed.

The timing controller 400 transmits an input image signal RGB, which is received from a host system, to the data driving circuit 300. The timing controller 400 generates a timing control signal for controlling an operation timing of the gate driving circuit 200 and the data driving circuit 300 using timing signals such as a clock signal DCLK, a horizontal synchronization signal Hsync, a vertical synchronization signal Vsync, and a data enable signal DE which are received together with the input image signal RGB. In this case, the horizontal synchronization signal Hsync is a signal indicating a time taken to display one horizontal line of a screen and the vertical synchronization signal Vsync is a signal indicating a time taken to display a screen of one frame. Further, the data enable signal DE is a signal indicating a period when a data voltage is supplied to a pixel P defined in the display panel 100. The timing controller 400 is synchronized with the timing signal to generate a control signal GCS of the gate driving circuit 200 and a control signal DCS of the data driving circuit 300.

The data driving circuit 300 generates a sampling signal by a data driving control signal DCS transmitted from the timing controller 400 and changes image data into a data signal by latching the image data input from the timing controller 400 in accordance with the sampling signal, and then supplies the data signal to the data lines DL1 to DLm in response to a source output enable (SOE) signal. The data driving circuit 300 is connected to a bonding pad of the display panel 100 by a chip on glass (COG) method or may be directly disposed on the display panel 100 and in some cases, the data driving circuit 300 may be disposed to be integrated with the display panel 100. Further, the data driving circuit 300 may be disposed by a chip on film (COF) method.

The gate driving circuit 200 sequentially supplies gate signals to the gate lines GL1 to GLn in accordance with a gate driving control signal GCS transmitted from the timing controller 400. The gate driving circuit 200 may include a shift register and a level shifter.

A normal gate driving circuit may be configured to be independently formed from the display panel to be electrically connected to the display panel in various methods. However, the gate driving circuit 200 of the display device according to the aspect of the present disclosure may be equipped on the non-display area N/A in the form of a thin film pattern as a gate in panel (GIP) type while manufacturing a substrate of the display panel 100. Even though in FIG. 1, it is illustrated that only one gate driving circuit 200 is equipped in the non-display area N/A of the display panel 100, the present disclosure is not limited thereto and two gate driving circuits 200 may be disposed.

The gate driving circuit 200 includes a plurality of stages including a shift register. Hereinafter, a detailed configuration and a driving method of a gate driving circuit according to an aspect of the present disclosure will be described.

Figure 2A:
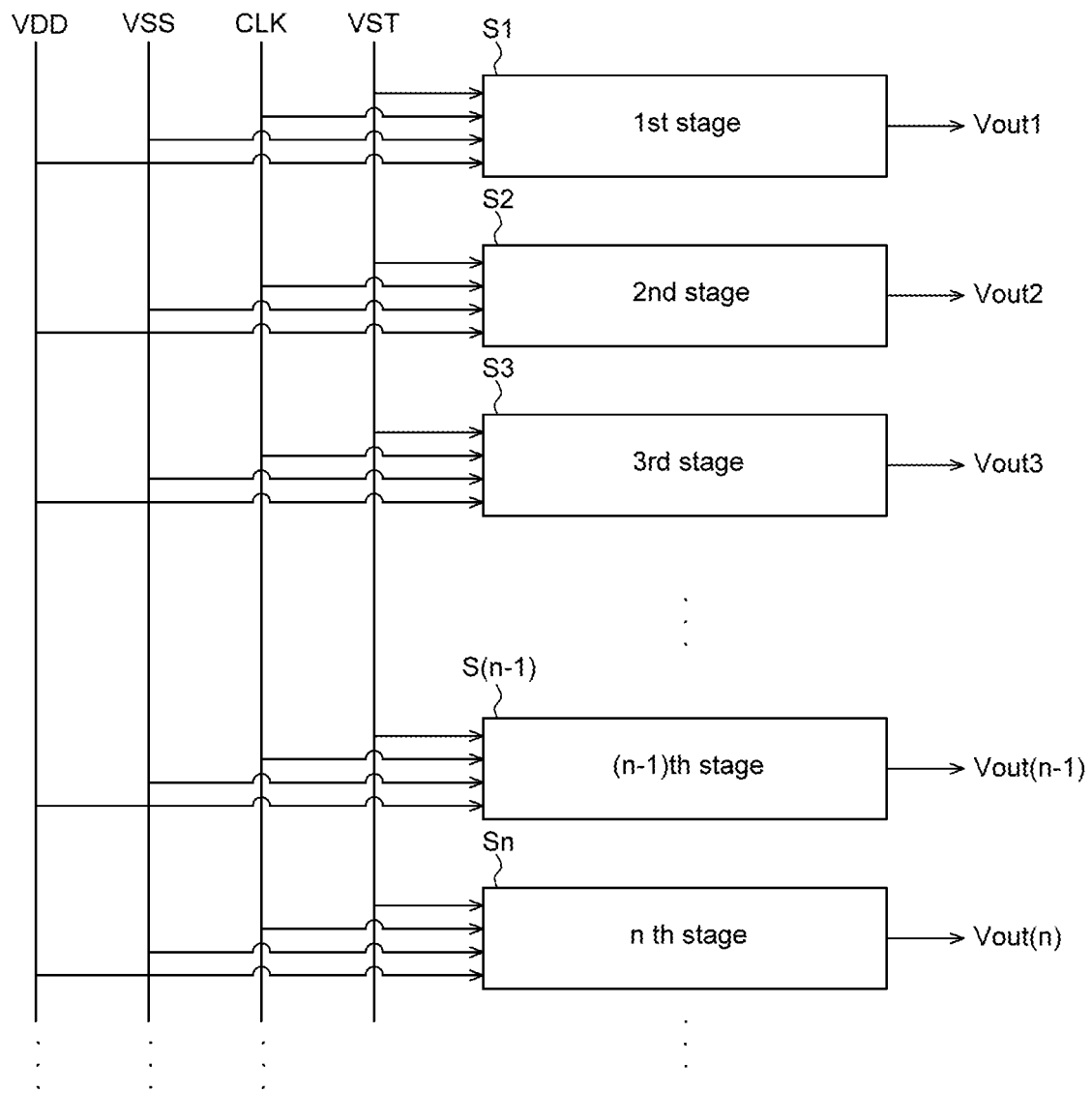
FIG. 2A is a block diagram for explaining a configuration of a gate driving circuit according to an aspect of the present disclosure.
Figure 2B:
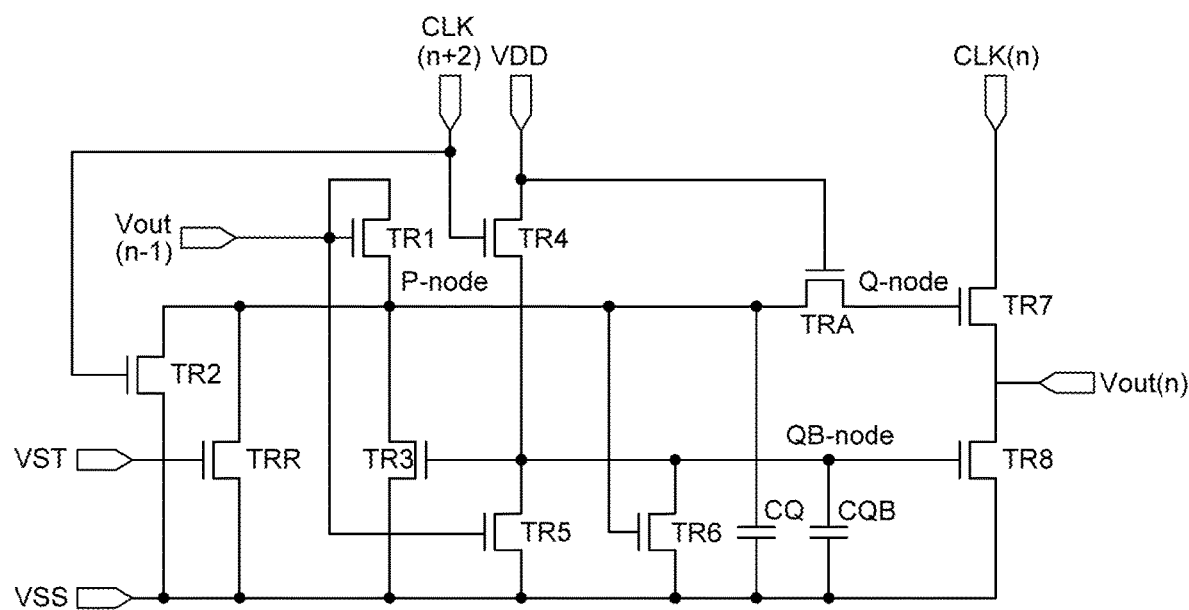
FIG. 2B is a view illustrating an equivalent circuit of each stage equipped in a gate driving circuit of a display device according to an aspect of the present disclosure.
Figure 2C:
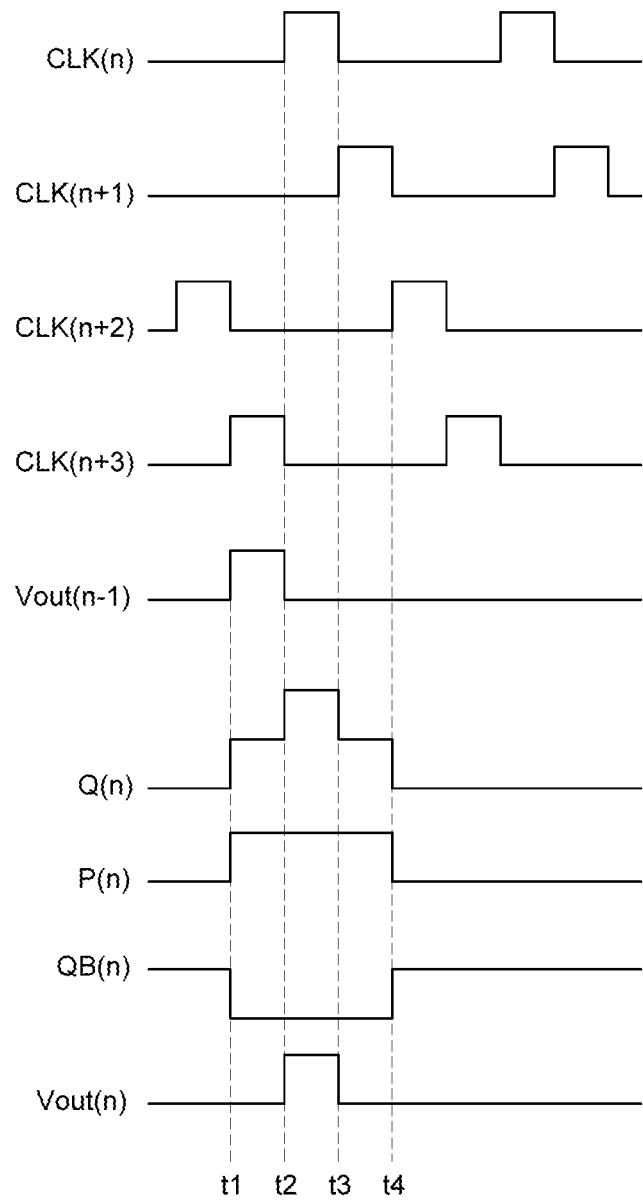
FIG. 2C is a timing chart illustrating a signal applied to the equivalent circuit of each stage illustrated in FIG. 2B.

FIG. 2A is a block diagram for explaining a configuration of a gate driving circuit according to an aspect of the present disclosure, FIG. 2B is a view illustrating an equivalent circuit of each stage equipped in a gate driving circuit of a display device according to an aspect of the present disclosure, and FIG. 2C is a timing chart illustrating a signal applied to an equivalent circuit of each stage illustrated in FIG. 2B.

Referring to FIG. 2A, the gate driving circuit 200 according to an aspect of the present disclosure may be configured by a shift register including first to n-th stages S1, S2, S3, . . . S(n−1), and S(n) which receive a power source voltage VDD and a ground voltage VSS and output gate voltages Vout1, Vout2, Vout3, . . . Vout(n−1), Vout(n) to gate lines GL1, . . . GLn in accordance with a clock signal CLK.

Referring to FIG. 2C, the clock signal CLK may include clock signals CLK(n), CLK(n+1), CLK(n+2), and CLK(n+3) having different phases. Here, the clock signal CLK may be a four-phase clock signal CLK whose duty ratio of a high level and a low level is 1:3. That is, CLK(n+1) has a delayed phase from that of CLK(n), CLK(n+2) has a delayed phase from that of CLK(n+1), and CLK(n+3) has a delayed phase from that of CLK(n+2).

Here, for the convenience of description, CLK(n) is set as a first clock signal and CLK(n+2) is set as a second clock signal to describe the driving method of each of the stages S1, S2, S3, . . . , S(n−1), and Sn.

Even though in the aspect of the present disclosure, the four-phase clock signal CLK is applied, the present disclosure is not limited thereto and the clock signal may vary in various types depending on a design of the gate driving circuit 200.

The first stage S1 is applied with a gate start signal VST at a start timing of a frame to output a first gate voltage Vout1 using the clock signal CLK and the second stage S2 to n-th stage Sn sequentially output second to n-th gate voltages Vout2 to Vout(n) using a plurality of clock signals CLK in accordance with an output voltage of a previous stage or an output voltage of a subsequent stage.

As described above, the stages S1, S2, S3, . . . S(n−1), Sn sequentially output the gate voltages Vout1, Vout2, Vout3, . . . Vout(n−1), Vout(n) so that the display device expresses one frame.

Further, the second stage S2 to the n-th stage Sn are applied with a gate start signal VST at a start timing of the frame to initialize a P node, a Q node, and a QB node which are internal nodes of the stages S2, S3, . . . S(n−1), and Sn.

By doing this, the second stage S2 to the n-th stage Sn are reset by the gate start signal VST at the start timing of the frame and the start timing of the frame may also be defined as a reset timing.

Hereinafter, an operation of the stages S1, S2, S3, . . . , S(n−1), and Sn which sequentially output the gate voltages Vout1, Vout2, Vout3, . . . , Vout(n−1), and Vout(n) will be described with respect to the n-th stage Sn as an example.

Switch elements which configure the gate driving circuit may be implemented by an n-type or a p-type MOSFET transistor. In the following aspect, an n-type transistor will be described as an example, but the present disclosure is not limited thereto.

A transistor is a three-electrode element including a gate, a source, and a drain. The source is an electrode which supplies carriers to the transistor. In the transistor, the carriers flow from the source. The drain is an electrode through which the carriers leave the transistor to the outside. That is, the carriers in the MOSFET flow from the source to the drain. In the case of the n-type MOSFET (NMOS), since the carriers are electrons, in order to allow the electrons to flow from the source to the drain, a source voltage may be lower than a drain voltage. In the n-type MOSFET, since the electrons flow from the source to the drain, the current flows from the drain to the source. In the case of a p-type MOSFET (PMOS), since the carriers are holes, in other to allow the holes to flow from the source to the drain, the source voltage is higher than the drain voltage. In the p-type MOSFET, since the holes flow from the source to the drain, the current flows from the source to the drain. However, it should be noted that the source and the drain of the MOSFET are not fixed. For example, the source and the drain of the MOSFET may be changed in accordance with an applied voltage. In the following aspect, the disclosure should not be limited by the source and the drain of the transistor.

Specifically, in the gate driving circuit 200 of the present disclosure, an LTPS transistor which uses a low temperature poly silicon (hereinafter, abbreviated as LTPS) which is a transistor having polycrystalline semiconductor material as an active layer may be used. The polysilicon material has a high mobility (100 cm$^2$/Vs or higher), low power consumption, and excellent reliability, so that it may be applied to a transistor for a driving element.

Referring to FIG. 2B, the n-th stage of the gate driving circuit includes first node control units TR1, TR2, TR3, and TRR, second node control units TR4, TR5, and TR6, a protective transistor TRA, a first capacitor CQ, a second capacitor CQB, and output units TR7 and TR8.

The first capacitor CQ may be connected to the P node and the ground voltage VSS and the second capacitor CQB may be connected to the QB node and the ground voltage VSS.

The first node control units TR1, TR2, TR3, and TRR control the voltages of the P node and the Q node connected to the P node. In other words, the first node control units TR1, TR2, TR3, and TRR determine charging and discharging timings of the P node and the Q node connected to the P node.

The first node control units TR1, TR2, TR3, and TRR include a first transistor TR1, a second transistor TR2, a third transistor TR3, and a reset transistor TRR.

Here, the P node and the Q node are connected via the protective transistor TRA which is turned on by a high level power source voltage VDD so that the P node and the Q node have the same potential excluding an output timing t2 of the gate voltage.

Here, referring to FIG. 2C, at the output timing t2 of the gate voltage, as it will be described below, the Q node connected to source electrode or drain electrode of the protective transistor TRA is bootstrapped by a first clock signal CLK(n), so that the voltage of the Q node may be higher than a voltage of the P node.

The gate electrode and a first electrode of the first transistor TR1 are connected to the output terminal Vout(n−1) of the (n−1)-th stage and a second electrode thereof is connected to the P node. The first transistor TR1 charges the P node and the Q node in response to the gate voltage Vout(n−1) of the (n−1)-th stage.

A gate electrode of the second transistor TR2 is connected to an output terminal of a second clock signal CLK(n+2), a first electrode is connected to the ground voltage VSS, and a second electrode is connected to the P node. When the second clock signal CLK(n+2) is a high level, the second transistor TR2 discharges the P node and the Q node to the ground voltage VSS.

A gate electrode of the third transistor TR3 is connected to the QB node, a first electrode is connected to the ground voltage VSS, and a second electrode is connected to the P node. When the voltage of the QB node is a high level, the third transistor TR3 discharges the P node and the Q node to the ground voltage VSS.

A gate electrode of the reset transistor TRR is connected to an output terminal of a gate start pulse VST, a first electrode is connected to the ground voltage VSS which is a low level power source, and a second electrode is connected to the P node. The reset transistor TRR discharges the P node and the Q node to the ground voltage VSS in response to the gate start pulse VST.

The second node control units TR4, TR5, and TR6 control the voltage of the QB node. In other words, the second node control units TR4, TR5, and TR6 determine the charging and discharging timings of the QB node.

The second node control units TR4, TR5, and TR6 include a fourth transistor TR4, a fifth transistor TR5, and a sixth transistor TR6.

A gate electrode of the fourth transistor TR4 is connected to an output terminal of the second clock signal CLK(n+2), a first electrode is connected to the power source voltage VDD which is a high level, and a second electrode is connected to the QB node. When the second clock signal CLK(n+2) is a high level, the fourth transistor TR4 charges the QB node with a high level power source voltage VDD.

A gate electrode of the fifth transistor TR5 is connected to an output terminal of the (n−1)-th stage, a first electrode is connected to the low level ground voltage VSS, and a second electrode is connected to the QB node. The fifth transistor TR5 discharges the QB node to the ground voltage VSS which is a low level power source in response to the gate voltage Vout(n−1) of the (n−1)-th stage.

A gate electrode of the sixth transistor TR6 is connected to the P node, a first electrode is connected to the ground voltage VSS which is a low level power source, and a second electrode is connected to the QB node. When the voltage of the P node is a high level, the sixth transistor TR6 discharges the QB node to the ground voltage VSS which is a low level power source.

The protective transistor TRA may protect transistors connected to the P node, for example, the first transistor TR1, the second transistor TR2, and the third transistor TR3 which are the first node control units. Specifically, a gate of the protective transistor TRA is connected to the power source voltage VDD, a first electrode is connected to the P node, and a second electrode is connected to the Q node.

A general protective transistor TRA is applied with the same voltage, that is, the power source voltage VDD excluding a timing t2 at which the gate voltage is output.

Here, referring to FIG. 2C, at the output timing t2 of the gate voltage, as it will be described below, the Q node connected to the first electrode of the protective transistor TRA is bootstrapped by a first clock signal CLK(n), so that the voltage of the Q node may be higher than a voltage of the P node.

That is, when the Q node is bootstrapped, at the output timing t2 of the gate voltage, even though the voltage of the Q node rises, the protective transistor TRA suppresses the voltage of the P node from rising, to protect the transistors TR1, TR2, TR3, and TRR of the first node control units connected to the P node.

The output units TR7 and TR8 include a seventh transistor TR7 which pulls up the n-th gate voltage Vout(n) and an eighth transistor TR8 which pulls down the n-th gate voltage Vout(n).

A gate of the seventh transistor TR7 is connected to the Q node, a first electrode is connected to the first clock signal CLK(n) terminal, and a second electrode is connected to an output terminal Vout(n) of the n-th stage. When the Q node is in a charged state, the seventh transistor TR7 outputs the first clock signal CLK(n) to the output terminal Vout(n) of the n-th stage.

A gate of the eighth transistor TR8 is connected to the QB node, a first electrode is connected to the output terminal Vout(n) of the n-th stage, and a second electrode is connected to the ground voltage VSS. When the QB node is in a charged state, the eighth transistor TR8 discharges a potential of the output terminal Vout(n) of the n-th stage to the ground voltage VSS.

The first capacitor is connected between the ground power source VSS and the Q node to stabilize the Q node and the second capacitor CQB is connected between the ground power source VSS and the QB node to stabilize the QB node.

The driving of the n-th stage of the gate driving circuit according to the aspect of the present disclosure will be described below with reference to FIG. 2C. [0078] At a first timing t1, the first transistor TR1 is turned on by the output voltage Vout(n−1) of the n−1-th stage to charge the P node and the Q node, the fifth transistor TR5 is turned to discharge the QB node, and the sixth transistor TR6 is turned on by the voltage charged in the Q node to discharge the QB node.

Next, at a second timing t2, the Q node is bootstrapped by the first clock signal CLK(n) which rises to a high level to turn on the seventh transistor TR7 so that a high level gate voltage may be output to the output terminal Vout(n) of the n-th stage.

More specifically, referring to FIG. 2B, when the first clock signal CLK(n) rises to a high level at the second timing t2, the voltage of the Q node rises by being coupled to the voltage rising of the first clock signal CLK(n) by the first electrode of the seventh transistor TR7 and a parasitic capacitance of the Q node which is a gate electrode. The phenomenon that the voltage of the Q node increases at the second timing t2 is referred to as bootstrapping.

As described above, the Q node is bootstrapped so that the seventh transistor TR7 is fully turned on and a high level gate voltage is output to the output terminal Vout(n) of the n-th stage.

Next, at a third timing t3, the seventh transistor TR7 is turned off by the falling first clock signal CLK(n) which is a low level so that the high level gate voltage is not output to the output terminal Vout(n) of the n-th stage.

More specifically, when the first clock signal CLK(n) falls to a low level at the third timing t3, the voltage of the Q node also falls by being coupled to the voltage falling of the first clock signal CLK(n) by the first electrode of the seventh transistor TR7 and a parasitic capacitance of the Q node which is a gate electrode.

As described above, since the voltage of the Q node falls, the seventh transistor TR7 is turned off and the high level gate voltage is not output to the output terminal Vout(n) of the n-th stage.

Next, at a fourth timing t4, the fourth transistor TR4 is turned on by the second clock signal CLK(n+2) which rises to a high level to charge the QB node and the third transistor TR3 is turned on by the voltage of the charged QB node to discharge the P node. Further, the eighth transistor TR8 is turned on to discharge the output terminal Vout(n) of the n-th stage to the ground voltage VSS.

Further, the stages S1, S2, S3, . . . , S(n−1), and Sn of the gate driving circuit according to the aspect of the present disclosure may further include a second transistor TR2. By doing this, a path for discharging the Q node and the P node by turning on the second transistor TR2 by the second clock signal CLK(n+2) rising to a high level at a fourth timing t4 at which the Q node and the P node are discharged is further formed. Therefore, the discharging speed of the Q node and the P node may be improved.

Specifically, the on-current Ion and whether the gate driving circuit normally operates in the severe environment of a low temperature and a high temperature are represented in Table 1.

TABLE 1

| Ion[μA] | 45.4 | 24.2 | 18.7 | 13.0 | 6.8 | 2.1 |
|---|---|---|---|---|---|---|
| Lowering rate[%] | — | −46.7 | −58.8 | −71.4 | −85.0 | −95.4 |
| Comp. Ex | OK | OK | OK | OK | NG | NG |
| Example | OK | OK | OK | OK | OK | OK |

With regard to this, in a comparative example, stages S1, S2, S3, . . . , S(n−1), and Sn of the gate driving circuit do not include a second transistor TR2 and in an example, stages S1, S2, S3, . . . , S(n−1), and Sn of the gate driving circuit include a second transistor TR2.

As represented in Table 1, the lower the temperature of the environment where the display device is exposed, the lower the on-current Ion of the transistor.

Alternatively, as the time elapses in a high temperature reliability environment of the display device, the on-current Ion is further lowered.

Therefore, when the on-current Ion of the transistor is 6.8 □A or lower, that is, a lowering rate of the on-current Ion is 85% or higher, the gate driving circuit according to the comparative example abnormally operates (NG), but the gate driving circuit according to the example normally operates (OK).

In the comparative example, since the stages S1, S2, S3, . . . , S(n−1), and Sn of the gate driving circuit do not include a second transistor TR2, the Q node and the P node need to be discharged only using the third transistor TR3 so that the discharging speed of the Q node and the P node is relatively low. Therefore, the Q node and the P node are not discharged at the gate voltage output timing of a subsequent stage.

Therefore, the first clock signal CLK(n) rises to the high level to output the gate voltage of the subsequent stage, the Q node is bootstrapped to fully turn on the seventh transistor TR7. Therefore, the gate voltage Vout(n) of the nth stage which is not intended is also output, so that the display device may be abnormally driven.

However, in the example of the present disclosure, since the stages S1, S2, S3, . . . , S(n−1), and Sn of the gate driving circuit include a second transistor TR2, the Q node and the P node are discharged not only by the third transistor TR3, but also by the second transistor TR2 so that the discharging speed of the Q node and the P node is improved. Therefore, the Q node and the P node are discharged at the gate voltage output timing of a subsequent stage.

Therefore, when the first clock signal CLK(n) rises to the high level to output the gate voltage of the subsequent stage, the Q node is bootstrapped. However, at the gate voltage output timing, the Q node is bootstrapped in a discharged state so that the seventh transistor TR7 is not fully turned on. Therefore, the gate voltage Vout(n) of the nth state is not output, so that the display device may be normally driven.

That is, when the first clock signal CLK(n) rises to the high level at the gate voltage timing, in the comparative example, the Q node is not sufficiently discharged so that the Q node is bootstrapped to unintentionally turn on the seventh transistor TR7 and output a gate voltage which is not intended. In contrast, in the example of the present disclosure, the Q node is sufficiently discharged so that the seventh transistor TR7 is not turned on by the bootstrapping of the Q node. Therefore, the gate voltage which is not intended is not output.

As described above, the gate driving circuit according to the aspect of the present disclosure additionally includes a transistor for improving a discharging speed of the Q node and the P node in each stage so that the reliability of the gate driving circuit may be improved even in the severe environment of a low temperature and a high temperature.

Hereinafter, a circuit structure and a driving method of a gate driving circuit according to another aspect of the present disclosure will be described in more detail with reference to FIGS. 3A to 3C.

Specifically, components and a driving method of the gate driving circuit according to another aspect of the present disclosure are the same as those of the gate driving circuit according to the aspect of the present disclosure except for an applying method of a gate start signal VST and the presence of a waveform reset transistor TRR of a clock signal CLK so that the difference will be described below.

Figure 3A:
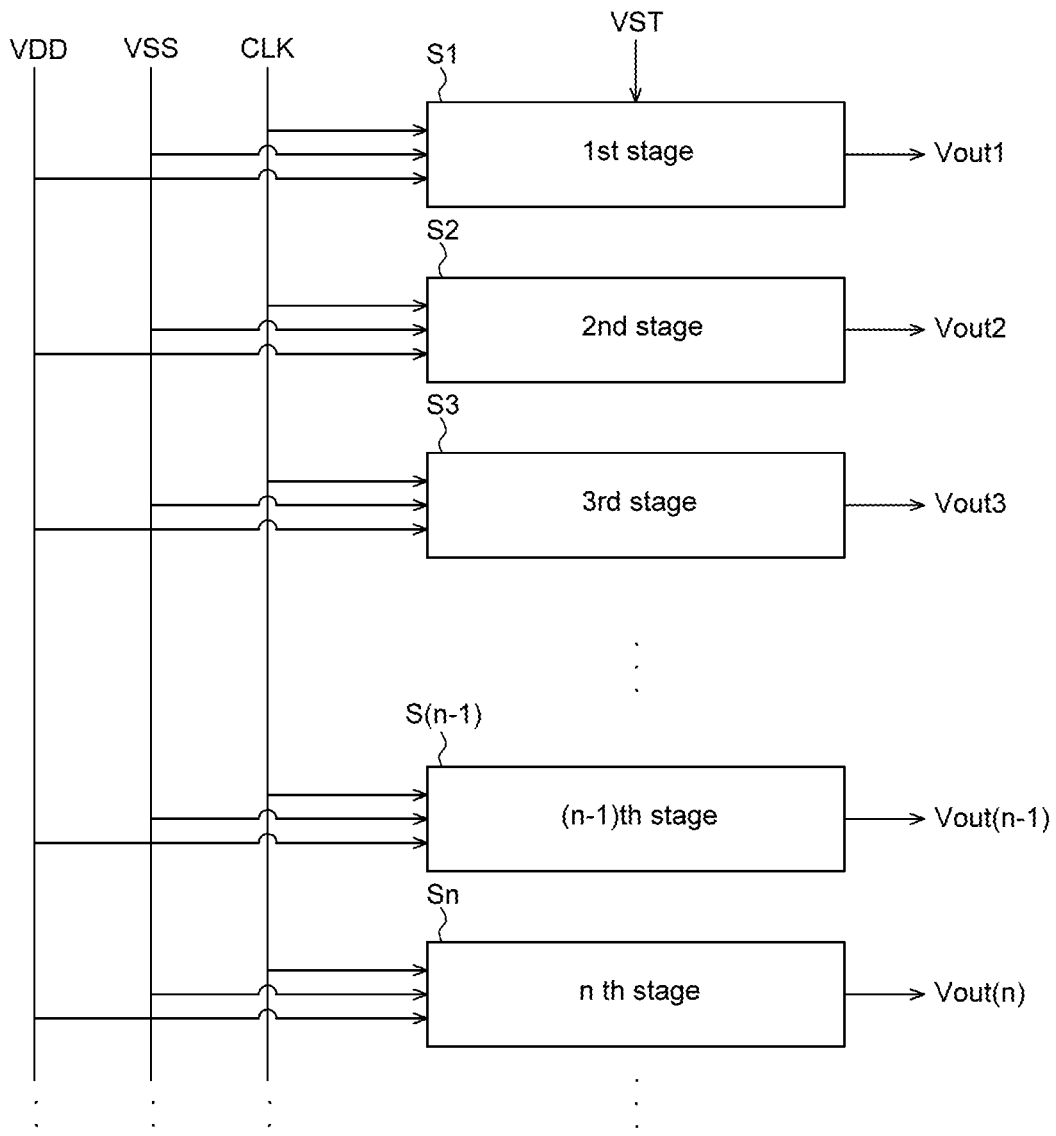
FIG. 3A is a block diagram for explaining a configuration of a gate driving circuit according to another aspect of the present disclosure.
Figure 3B:
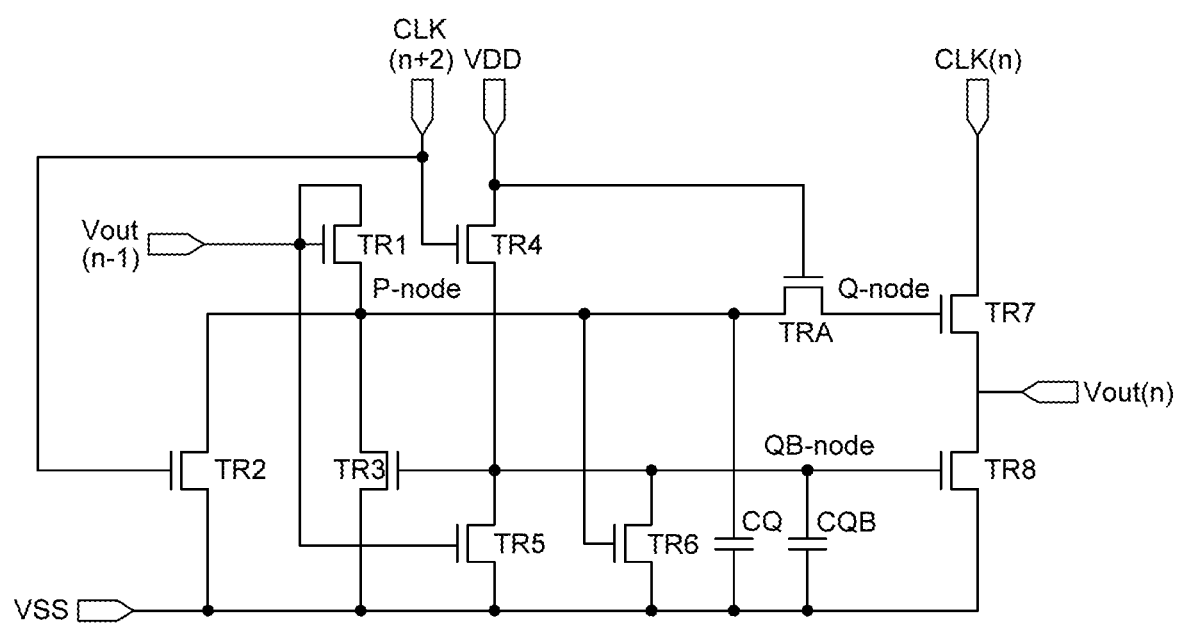
FIG. 3B is a view illustrating an equivalent circuit of each stage equipped in a gate driving circuit of a display device according to another aspect of the present disclosure.
Figure 3C:
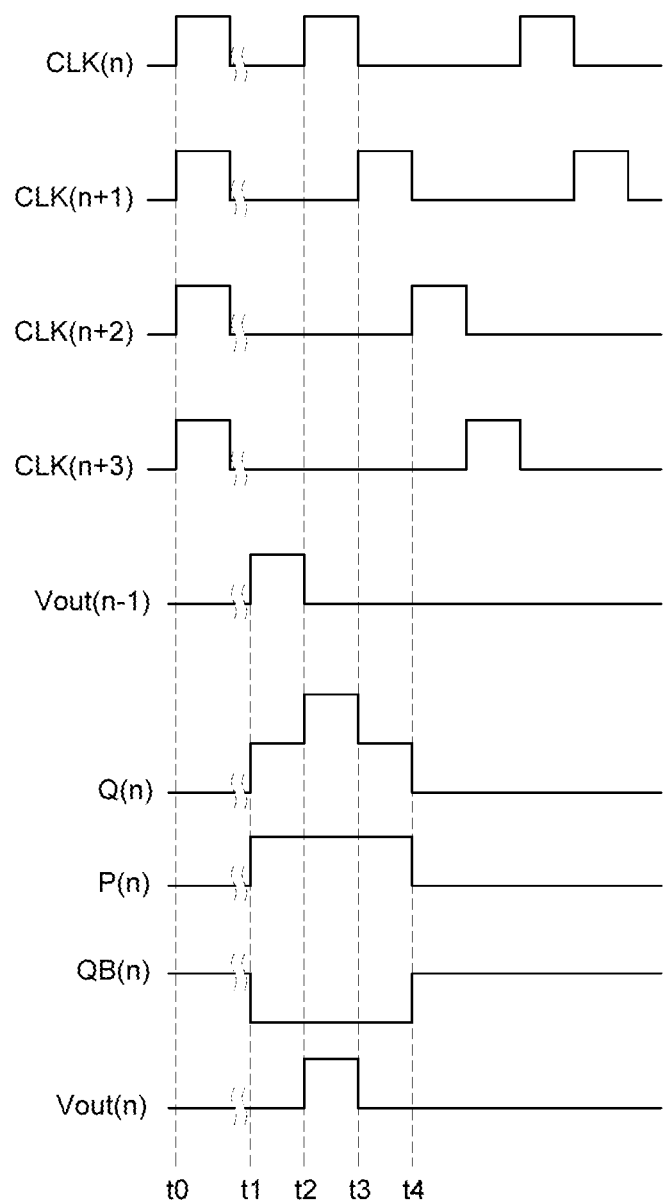
FIG. 3C is a timing chart illustrating a signal applied to the equivalent circuit of each stage illustrated in FIG. 3B.

FIG. 3A is a block diagram for explaining a configuration of a gate driving circuit according to another aspect of the present disclosure, FIG. 3B is a view illustrating an equivalent circuit of each stage equipped in a gate driving circuit of a display device according to another aspect of the present disclosure, and FIG. 3C is a timing chart illustrating a signal applied to an equivalent circuit of each stage illustrated in FIG. 3B.

Referring to FIG. 3A, a gate driving unit according to another aspect of the present disclosure applies a gate start signal VST only to a first stage S1 at a start timing of a frame so that the first stage S1 outputs a first gate voltage Vout1 using a clock signal CLK.

Further, a second stage S2 to n-th stage Sn sequentially output second to n-th gate voltages Vout2 to Vout(n) using a plurality of clock signals CLK in accordance with an output voltage of a previous stage or an output voltage of a subsequent stage.

That is, the gate start signal VST is not applied to the second stage S2 to n-th stage Sn.

In the aspect of the present disclosure, the second stage S2 to n-th stage Sn are reset by the gate start signal VST at the start timing of the frame, but in another aspect of the present disclosure, the gate start signal VST is not applied to the second stage S2 to n-th stage Sn at the start timing of the frame.

However, the gate driving circuit according to another aspect of the present disclosure needs to initialize the P node, the Q node, and the QB node which are internal nodes of the stages S2, S3, . . . , S(n−1), and Sn at the frame start timing or the reset timing.

Therefore, in another aspect of the present disclosure, the clock signal CLK and the gate start signal VST are collectively output to initialize the stages S2, S3, . . . , S(n−1), and Sn.

Specifically, referring to FIG. 3B, there is no output voltage Vout(n−1) of a previous stage of the first stage S1 so that the gate start signal VST is applied to an output voltage Vout(n−1) terminal of the previous stage. Further, the gate start signal VST is not applied to the second stage S1 to n-th stage Sn at the start timing of the frame so that the first node control units TR1, TR2, and TR3 only include a first transistor TR1, a second transistor TR2, and a third transistor TR3, but do not include the reset transistor TRR. [00108] More specifically, in order to allow the second transistor TR2 to have a function of a reset transistor TRR, all clock signals CLK(n), CLK(n+1), CLK(n+2), and CLK(n+3) including the second clock signal CLK(n+2) according to another aspect of the present disclosure may include the gate start signal VST according to the aspect of the present disclosure.

Specifically, referring to FIG. 2C, the clock signal according to the aspect of the present disclosure outputs only the gate start signal VST at a frame reset timing, but all four-phase clock signals CLK(n), CLK(n+1), CLK(n+2), and CLK(n+3) are output in accordance with each clock timing. However, referring to FIG. 3C, in another aspect of the present disclosure, all four-phase clock signals CLK(n), CLK(n+1), CLK(n+2), and CLK(n+3) rise to a high level in accordance with the frame reset timing t0. That is, in another aspect of the present disclosure, the gate start signal VST is not separately output, but all four-phase clock signals CLK(n), CLK(n+1), CLK(n+2), and CLK(n+3) are output with a waveform including the gate start signal VST. Further, the operation of the gate driving circuit after the first timing t1 is the same as the operation of the gate driving circuit according to the aspect of the present disclosure described above.

As described above, all clock signals CLK(n), CLK(n+1), CLK(n+2), and CLK(n+3) rise to a high level at the frame reset timing t0, so that the second transistor TR2 is turned on to discharge the P node and the Q node to the ground voltage VSS to be initialized.

However, another aspect of the present disclosure has been described with respect to the n-th stage Sn illustrated in FIG. 3B, so that in order to reset only the n-th stage Sn, only the second clock signal CLK(n+2) rises at the frame reset timing t0. However, in order to reset the frame, not only the n-th stage Sn, but all stages S1, S2, S3, . . . , S(n−1), and S(n) need to be reset. Therefore, not only the second clock signal CLK(n+2), all the clock signals CLK(n), CLK(n+1), CLK(n+2), and CLK(n+3) need to rise to a high level.

[00112] As described above, in the gate driving circuit according to another aspect of the present disclosure, the reset transistor is removed and the frame reset by the clock signals CLK(n), CLK(n+1), CLK(n+2), and CLK(n+3) including the gate start signal VST is performed by the second transistor. Therefore, the equivalent circuit of each stage is simplified.

Therefore, the integration efficiency of the GIP type gate driving circuit is increased so that a bezel area which is an area occupied by the GIP type gate driving circuit of the display device is reduced.

The aspects of the present disclosure can also be described as follows:

According to an aspect of the present disclosure, a gate driving circuit includes a plurality of stages which is connected to each other, each of the plurality of stages includes an output unit which outputs a first clock signal as a gate voltage in accordance with a voltage of a Q node and a voltage of a QB node, a first node control unit which controls the voltage of the Q node, and a second node control unit which controls the QB node, and the first node control unit includes a second transistor which discharges the Q node and a third transistor which discharges the Q node, the second transistor outputs a ground voltage to the Q node, in response to a second clock signal and the third transistor outputs the ground voltage to the Q node, in response to the voltage of the QB node. Therefore, it is possible to improve the discharging speed lowering phenomenon of the Q node of the gate driving circuit in a severe environment of a low temperature and a high temperature.

The first node control unit may further include a first transistor which charges the Q node.

The first node control unit may further include a reset transistor which outputs the ground voltage to the Q node, in response to a gate start signal.

The first clock signal and the second clock signal may rise from a low level to a high level, at a reset timing of all frames.

A rising timing of the voltage of the QB node may coincide with a rising time of the second clock signal.

the second node control unit may include a fourth transistor which outputs a power source voltage to the QB node, in response to the second clock signal, a fifth transistor which outputs the ground voltage to the QB node, in response to a gate voltage of a previous stage, and a sixth transistor which outputs the ground voltage to the QB node, in response to the voltage of the Q node.

A protective transistor in which a gate electrode may be connected to a power source voltage and source electrode or drain electrode may be connected to the Q node.

A first capacitor in which source electrode or drain electrode may be connected to the Q node and the other electrode may be connected to the ground voltage.

A second capacitor in which source electrode or drain electrode may be connected to the QB node and the other electrode may be connected to the ground voltage.

According to another aspect of the present disclosure, a display device includes a display panel including a plurality of pixels, a gate driving circuit which is configured by a plurality of stages to sequentially output a gate voltage to the plurality of pixels, and a timing controller which controls the driving of the gate driving circuit. Each of the plurality of stages includes an output unit which outputs a first clock signal as a gate voltage in accordance with a voltage of a Q node and a voltage of a QB node, a first node control unit which controls the voltage of the Q node, and a second node control unit which controls the voltage of the QB node and the first node control unit includes a second transistor which discharges the Q node, in response to a second clock signal and a third transistor which discharges the Q node, in response to a voltage of the QB node. Therefore, it is possible to improve the reliability of the display device in the severe environment of a low temperature and a high temperature.

The first node control unit may further include a first transistor which charges the Q node.

The first node control unit may further include a reset transistor which discharges the Q node, in response to a gate start signal.

The first clock signal and the second clock signal may rise from a low level to a high level, at a reset timing of all frames.

A rising timing of the voltage of the QB node may coincide with a rising time of the second clock signal.

Although the aspects of the present disclosure have been described in detail with reference to the accompanying drawings, the present disclosure is not limited thereto and may be embodied in many different forms without departing from the technical concept of the present disclosure. Therefore, the aspects of the present disclosure are provided for illustrative purposes only but not intended to limit the technical concept of the present disclosure. The scope of the technical concept of the present disclosure is not limited thereto. Therefore, it should be understood that the above-described aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A gate driving circuit, comprising:
   a plurality of stages connected to one another, wherein each of the plurality of stages includes:
   an output unit which outputs a first clock signal as a gate voltage in accordance with a voltage of a Q node and a voltage of a QB node;
   a first node control unit which controls the voltage of the Q node; and
   a second node control unit which controls the QB node, wherein the first node control unit includes second and third transistors which discharge the Q node, the second transistor outputs a ground voltage to the Q node in response to a second clock signal, and the third transistor outputs the ground voltage to the Q node in response to the voltage of the QB node,
   wherein all clock signals including the first clock signal and the second clock signal simultaneously rise from a low level to a high level at a reset timing of all frames, and
   wherein the plurality of stages are reset at the reset timing of all frames.

2. The gate driving circuit according to claim 1, wherein the first node control unit further includes a first transistor which charges the Q node.

3. The gate driving circuit according to claim 1, wherein the voltage of the QB node has a rising timing that coincides with a rising time of the second clock signal.

4. The gate driving circuit according to claim 1, wherein the second node control unit includes:
   a fourth transistor which outputs a power source voltage to the QB node in response to the second clock signal,
   a fifth transistor which outputs the ground voltage to the QB node in response to a gate voltage of a previous stage, and
   a sixth transistor which outputs the ground voltage to the QB node in response to the voltage of the Q node.

5. The gate driving circuit according to claim 1, further comprising a protective transistor in which a gate electrode is connected to a power source voltage and source electrode or drain electrode is connected to the Q node.

6. The gate driving circuit according to claim 1, further comprising a first capacitor in which one of source electrode and drain electrode is connected to the Q node and the other electrode is connected to the ground voltage.

7. The gate driving circuit according to claim 1, further comprising a second capacitor in which one of source electrode and drain electrode is connected to the QB node and the other electrode is connected to the ground voltage.

8. A display device, comprising:
   a display panel including a plurality of pixels;
   a gate driving circuit including a plurality of stages sequentially output a gate voltage to the plurality of pixels; and
   a timing controller which controls the driving of the gate driving circuit,
   wherein each of the plurality of stages includes,
   an output unit which outputs a first clock signal as a gate voltage in accordance with a voltage of a Q node and a voltage of a QB node,
   a first node control unit which controls the voltage of the Q node, and
   a second node control unit which controls the voltage of the QB node,
   wherein and the first node control unit includes a second transistor which discharges the Q node in response to a second clock signal and a third transistor which discharges the Q node, in response to the voltage of the QB node, and
   wherein all clock signals including the first clock signal and the second clock signal simultaneously rise from a low level to a high level at a reset timing of all frames and
   wherein the plurality of stages are reset at the reset timing of all frames.

9. The display device according to claim 8, wherein the first node control unit further includes a first transistor which charges the Q node.

10. The display device according to claim 8, wherein the voltage of the QB node has a rising timing that coincides with a rising time of the second clock signal.

* * * * *